(12) United States Patent
Lim et al.

(10) Patent No.: US 8,767,480 B2
(45) Date of Patent: Jul. 1, 2014

(54) SEMICONDUCTOR MEMORY DEVICE AND METHOD OF OPERATING THE SAME

(75) Inventors: Sang Oh Lim, Icheon-si (KR); Ho Youb Cho, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 70 days.

(21) Appl. No.: 13/492,204

(22) Filed: Jun. 8, 2012

(65) Prior Publication Data

US 2012/0314518 A1 Dec. 13, 2012

(30) Foreign Application Priority Data

Jun. 9, 2011 (KR) .................... 10-2011-0055531

(51) Int. Cl.
*G11C 7/00* (2006.01)
*G11C 8/00* (2006.01)

(52) U.S. Cl.
USPC .............. 365/189.05; 365/194; 365/210.1; 365/233.1; 365/236

(58) Field of Classification Search
USPC ............... 365/189.05, 194, 210.1, 233.1, 236
See application file for complete search history.

(56) References Cited

U.S. PATENT DOCUMENTS 4,847,809 A * 7/1989 Suzuki ..................... 365/189.05
5,268,865 A * 12/1993 Takasugi .................. 365/189.05

FOREIGN PATENT DOCUMENTS

KR 1020000019161 A 4/2000
KR 1020040064862 A 7/2004

* cited by examiner

*Primary Examiner* — Trong Phan
(74) *Attorney, Agent, or Firm* — William Park & Associates Patent Ltd.

(57) ABSTRACT

A semiconductor memory device includes a count clock generation unit for generating a count clock in response to a clock signal and a dummy count clock, a column address generation unit for generating a column address in response to the count clock, and a Y decoder for sending data, stored in a page buffer unit, to a data line in response to the column address.

20 Claims, 6 Drawing Sheets

SEMICONDUCTOR MEMORY DEVICE AND METHOD OF OPERATING THE SAME

CROSS-REFERENCE TO RELATED APPLICATION

The present application claims priority to Korean patent application number 10-2011-0055531 filed on Jun. 9, 2011, the entire disclosure of which is incorporated by reference herein, in its entirety.

BACKGROUND

1. Field of Invention

An embodiment of this disclosure relates to a semiconductor memory device and a method of operating the same and, more particularly, to a semiconductor memory device and a method of operating the same, which are capable of improving the time it takes for a data output operation.

2. Related Art

A non-volatile memory device of semiconductor memory devices is characterized in that data stored therein is retained although the supply of power has stopped.

In the data output operation of the non-volatile memory device, data stored in a plurality of page buffers is selected sequentially or randomly and externally outputted through a data line. To this end, a count clock (i.e., CK4CNT) is generated in response to a clock signal (i.e., CLK) that is toggled in a specific cycle, and a column address Col_Add is generated by counting the generated count clock. The Y decoder of the non-volatile memory device selectively outputs data, stored in the plurality of page buffers, to the data line in response to the column address.

Figure 1:
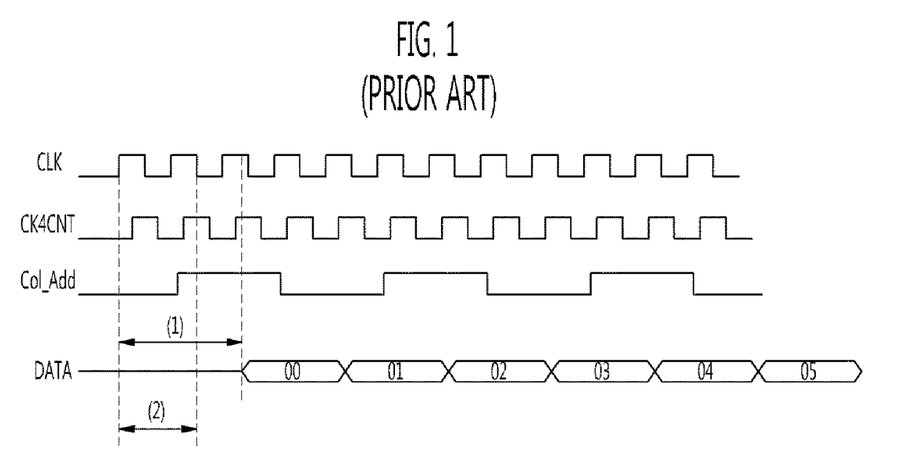
FIG. 1 illustrates waveforms of signals for illustrating the problems of a known data output operation.

FIG. 1 illustrates waveforms of signals for illustrating the problems of a known data output operation.

As illustrated in FIG. 1, the time (2) defined in the specification in a data output operation is shorter than the time (1) taken for data DATA (i.e., 00, 01, 02, 03, 04, 05) to be actually outputted after a clock signal CLK for data output is togged, and thus specification-over is generated. Accordingly, there is a problem in that the time taken for an actual data output operation is longer than the time defined in the specification.

BRIEF SUMMARY

An embodiment relates to a semiconductor memory device and a method of operating the same, which can improve the time taken for a data output operation by generating a dummy count clock and previously outputting some data to a data line using the dummy count clock, before a normal count clock is generated in the data output operation.

A semiconductor memory device according to an aspect of the present disclosure includes a count clock generation unit for generating a count clock in response to a clock signal and a dummy count clock, a column address generation unit for generating a column address in response to the count clock, and a Y decoder for sending data, stored in a page buffer unit, to a data line in response to the column address.

A semiconductor memory device according to another aspect of the present disclosure includes a page buffer unit for temporarily storing a plurality of read data; a Y decoder for sending the plurality of read data to a data line in response to a column address; a count clock generation unit for generating a count clock in response to a clock signal, and generating the count clock in response to a dummy count enable signal; and a column address generation unit for generating the column address by counting the count clock.

A method of operating a semiconductor memory device according to yet another aspect of the present disclosure includes generating a dummy count clock toggled by a set number; generating a first count clock in response to the dummy count clock; generating a first column address by counting the first count clock; outputting first output data, from among data stored in a page buffer, to a data line in response to the first column address.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 2:
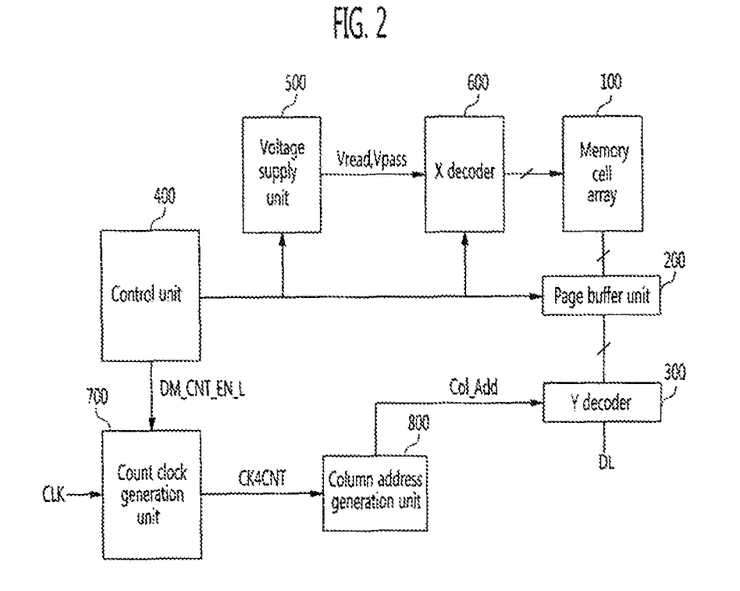
FIG. 2 illustrates the construction of a semiconductor memory device according to an example of an embodiment of this disclosure.

FIG. 2 illustrates the construction of a semiconductor memory device according to an exemplary embodiment of this disclosure.

Referring to FIG. 2, the semiconductor memory device may include a memory cell array 100, a page buffer unit 200, a Y decoder 300, a control unit 400, a voltage supply unit 500, an X decoder 600, a count clock generation unit 700, and a column address generation unit 800.

The memory cell array 100 may include a plurality of memory cells for storing data.

The page buffer unit 200 may include a plurality of page buffers. The plurality of page buffers may sense data stored in the memory cells of the memory cell array 100 and temporarily store the read data in a read operation.

The Y decoder 300 may couple a page buffer corresponding to a column address Col_Add, from among the plurality of page buffers, and a data line DL. Thus, read data temporarily stored in the selected page buffer may be outputted to the data line DL.

The control unit 400 may control the page buffer unit 200, the voltage supply unit 500, and the X decoder 600 so that data stored in the memory cell array is temporarily stored in the page buffer unit 200 in a data read operation. Furthermore, the control unit 400 may generate a dummy count enable signal DM_CNT_EN_L before a data output operation in order to control the count clock generation unit 700.

The count clock generation unit 700 may generate a count clock CK4CNT in response to a clock signal CLK in a data output operation and generates the count clock CK4CNT by a set number in response to the dummy count enable signal DM_CNT_EN_L enabled before the data output operation. The clock signal CLK may be generated in response to a read enable signal read enable RE_N in the data output operation.

The column address generation unit 800 may count the count clock CK4CNT generated from the count clock generation unit 700 and generate the column address Col_Add based on a result of the count. The generated column address Col_Add may be outputted to the Y decoder 300.

Figure 3:
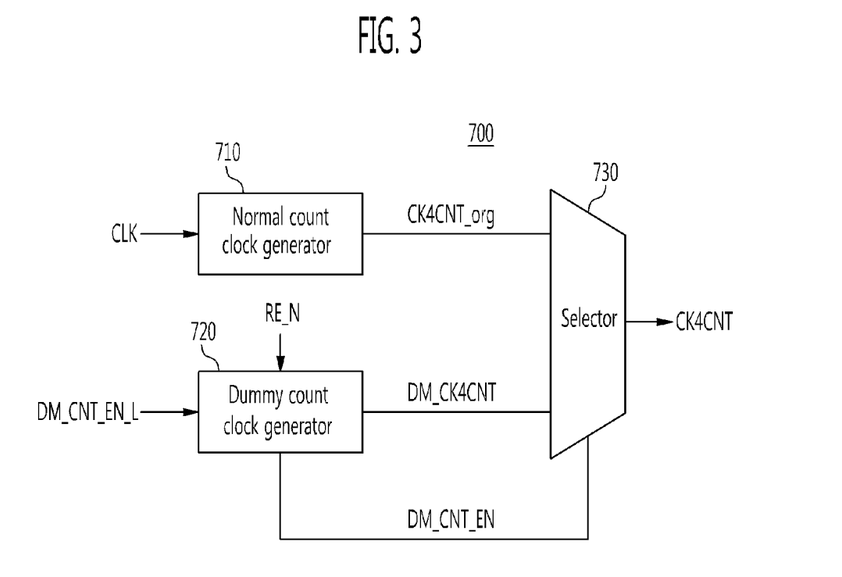
FIG. 3 illustrates the construction of a count clock generation unit illustrated in FIG. 2.

FIG. 3 illustrates the construction of the count clock generation unit 700 Illustrated in FIG. 2.

The count clock generation unit 700 may include a normal count clock generator 710, a dummy count clock generator 720, and a selector 730.

The normal count clock generator 710 may generate a normal count clock CK4CNT_org in response to the clock signal CLK.

The dummy count clock generator 720 may generate a dummy count clock DM_CK4CNT and an internal dummy count enable signal DM_CNT_EN in response to the dummy count enable signal DM_CNT_EN_L.

The selector 730 may output the normal count clock CK4CNT_org or the dummy count clock DM_CK4CNT as the count clock CK4CNT in response to the internal dummy count enable signal DM_CNT_EN. For example, when the internal dummy count enable signal DM_CNT_EN is enabled having a logic high level, the selector 730 may output the dummy count clock DM_CK4CNT as the count clock CK4CNT. When the internal dummy count enable signal DM_CNT_EN is disabled having a logic low level, the selector 730 outputs the normal count clock CK4CNT_org as the count clock CK4CNT. The selector 730 may be formed of a multiplexer.

Figure 4:
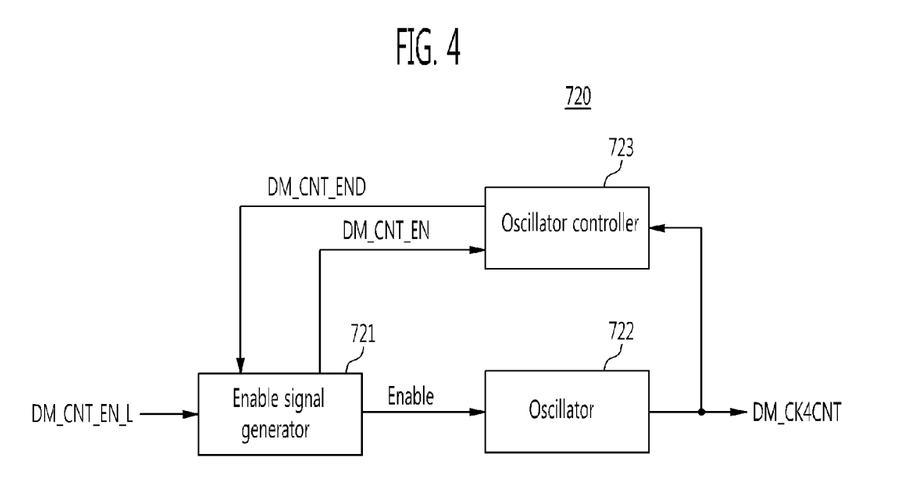
FIG. 4 illustrates the construction of a dummy count clock generator illustrated in FIG. 3.

FIG. 4 illustrates the construction of the dummy count clock generator 720 illustrated in FIG. 3.

Referring to FIG. 4, the dummy count clock generator 720 may include an enable signal generator 721, an oscillator 722, and an oscillator controller 723.

The enable signal generator 721 may generate an oscillator enable signal Enable and the internal dummy count enable signal DM_CNT_EN in response to the dummy count enable signal DM_CNT_EN_L and disable the oscillator enable signal Enable in response to a dummy clock end signal DM_CNT_END generated from the oscillator controller 723.

The oscillator 722 may generate the dummy count clock DM_CK4CNT having a specific cycle in response to the oscillator enable signal Enable.

The oscillator controller 723 may be enabled in response to the internal dummy count enable signal DM_CNT_EN. When the dummy count clock DM_CK4CNT generated from the oscillator 722 is toggled by a specific number, the oscillator controller 723 may generate the dummy clock end signal DM_CNT_END by detecting a specific number.

Figure 5:
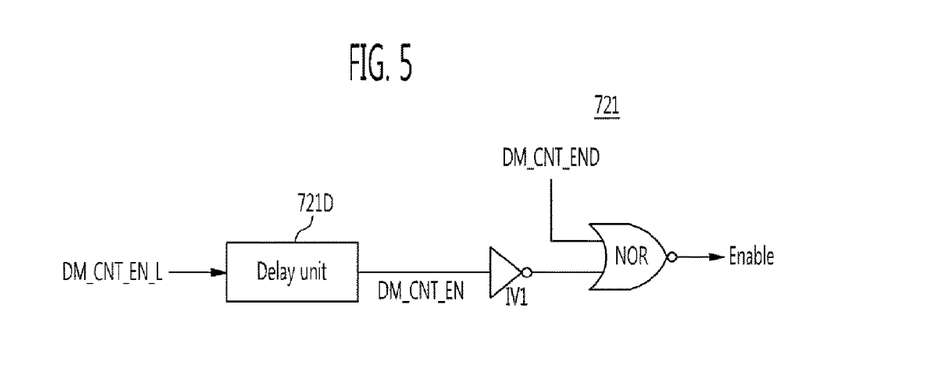
FIG. 5 is a circuit diagram of an enable signal generator illustrated in FIG. 4.

FIG. 5 is an example of a circuit diagram of the enable signal generator 721 illustrated in FIG. 4.

Referring to FIG. 5, the enable signal generator 721 may include a delay unit 721D, an inverter IV1, and a NOR gate NOR.

The delay unit 721D may generate the internal dummy count enable signal DM_CNT_EN by delaying the dummy count enable signal DM_CNT_EN_L for a set time.

The inverter IV1 may receive the internal dummy count enable signal DM_CNT_EN from the delay unit 721D and output an output signal having an inverted logic level. The NOR gate NOR may generate the oscillator enable signal Enable by logically combining the output signal of the inverter IV1 and the dummy clock end signal DM_CNT_END.

When the dummy count enable signal DM_CNT_EN_L enabled in a logic high level is received, the delay unit 721D may generate the internal dummy count enable signal DM_CNT_EN of a logic high level by delaying the dummy count enable signal DM_CNT_EN_L. Next, the inverter IV1 may output the output signal of a logic low level by inverting the internal dummy count enable signal DM_CNT_EN of a logic high level. The NOR gate NOR may generate the oscillator enable signal Enable of a logic high level by logically combining the output signal of a logic low level, generated from the inverter IV1, and the dummy clock end signal DM_CNT_END of a logic low level. Next, the NOR gate NOR may output the oscillator enable signal Enable of a logic low level in response to the dummy clock end signal DM_CNT_END which may shift to a logic high level.

Figure 6:
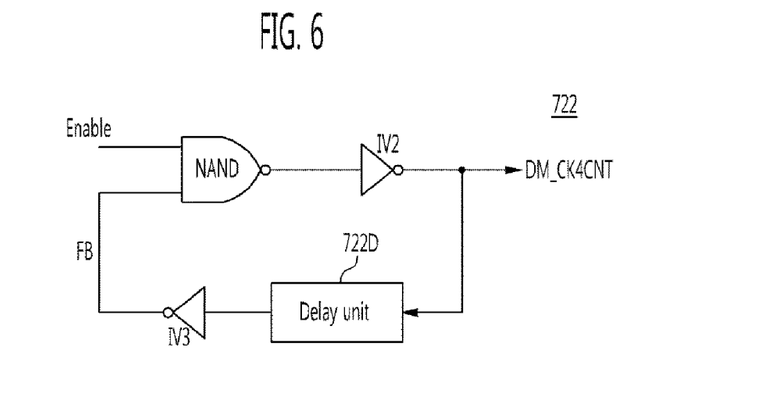
FIG. 6 is a circuit diagram of an oscillator illustrated in FIG. 4.

FIG. 6 is a circuit diagram of the oscillator 722 illustrated in FIG. 4.

Referring to FIG. 6, the oscillator 722 may include a NAND gate NAND, inverters IV2 and IV3, and a delay unit 722D.

The NAND gate NAND may generate the output signal by logically combining the oscillator enable signal Enable and a feedback signal FB. The inverter IV2 outputs the dummy count clock DM_CK4CNT by inverting the output signal of the NAND gate NAND. The delay unit 722D may delay the dummy count clock DM_CK4CNT for a set time and output the delayed dummy count clock DM_CK4CNT. The inverter IV3 may output the feedback signal FB by inverting the output signal of the delay unit 722D.

The NAND gate NAND may generate the output signal of a logic high level, in response to the oscillator enable signal Enable enabled in a logic high level and the feedback signal FB may reset to a logic low level. The inverter IV2 may generate the dummy count clock DM_CK4CNT, shifting from a logic high level to a logic low level, by inverting the output signal of the NAND gate NAND. The delay unit 722D may generate a signal of a logic low level by delaying the dummy count clock DM_CK4CNT, and the inverter IV3 may generate the feedback signal FB of a high level by inverting the signal of a logic low level. Accordingly, the output signal of the NAND gate NAND may shift to a logic low level. As the above-described operation is repeated, the dummy count clock DM_CK4CNT having a logic level continuously shifted may be generated. The clock cycle of the dummy count clock DM_CK4CNT may be determined by the delay time of the delay unit 722D.

Figure 7:
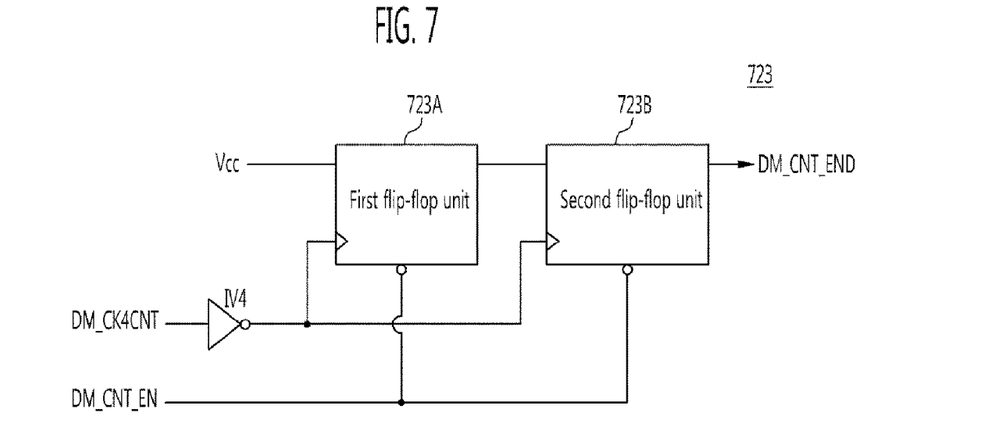
FIG. 7 is a circuit diagram of an oscillator controller illustrated in FIG. 4.

FIG. 7 is a circuit diagram of the oscillator controller 723 illustrated in FIG. 4.

Referring to FIG. 7, the oscillator controller 723 may include an inverter IV4, a first flip-flop unit 723A, and a second flip-flop unit 723B.

The inverter IV4 may invert the logic level of the dummy count clock DM_CK4CNT and output the dummy count clock DM_CK4CNT having an inverted logic level.

The first flip-flop unit 723A may be enabled in response to the internal dummy count enable signal DM_CNT_EN. The first flip-flop unit 723A may receive a power source voltage Vcc through an input terminal and output a synchronized output signal by synchronizing the power source voltage Vcc with the rising edge of the output signal of the inverter IV4. As a result, the output signal of the first flip-flop unit 723A may have a logic high level at the falling edge timing of the dummy count clock DM_CK4CNT.

The second flip-flop unit 723B may be enabled in response to the internal dummy count enable signal DM_CNT_EN. The second flip-flop unit 723B may receive the output signal of the first flip-flop unit 723A through an input terminal and output the dummy clock end signal DM_CNT_END by synchronizing the output signal of the first flip-flop unit 723A with the rising edge of the output signal of the inverter IV4. As a result, the second flip-flop unit 723B may output the dummy clock end signal DM_CNT_END having the same logic level as the output signal of the first flip-flop unit 723A at the falling edge timing of the dummy count clock DM_CK4CNT.

For example, at the falling edge timing of a first clock signal in the dummy count clock DM_CK4CNT having a specific cycle, the first flip-flop unit 723A may output the output signal having a logic high level. At the falling edge timing of a second clock signal in the dummy count clock DM_CK4CNT, the second flip-flop unit 723B may output the dummy clock end signal DM_CNT_END having a logic high level.

In the present embodiment, the oscillator controller 723 may be formed of the first flip-flop unit 723A and the second flip-flop unit 723B in order to generate the dummy count clock DM_CK4CNT twice. In some embodiments, additional flip-flop units may be added in order to increase the number of dummy count clocks DM_CK4CNT.

Figure 8:
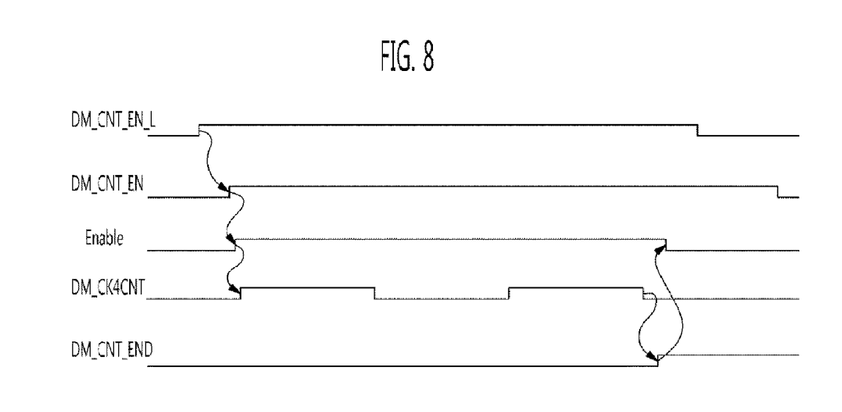
FIG. 8 illustrates waveforms of signals for illustrating an operation of the dummy count clock generator according to an embodiment of this disclosure.
Figure 9:
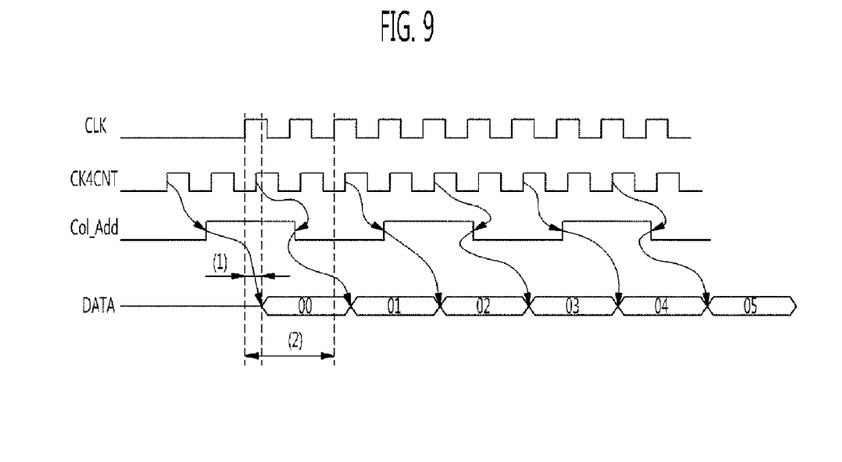
FIG. 9 illustrates waveforms of signals for illustrating a data output method of the semiconductor memory device according to an embodiment of this disclosure.
Figure 10A:
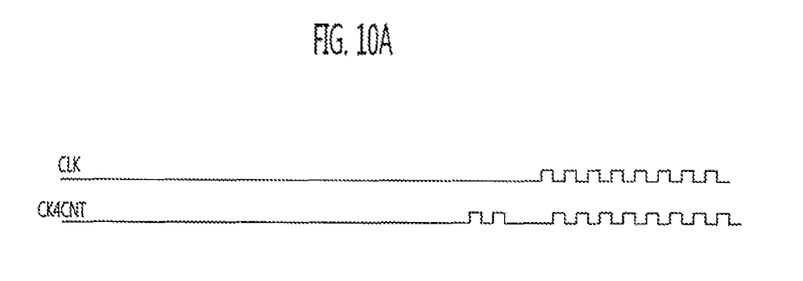
FIGS. 10A and 10B show waveforms of signals illustrating that count clocks may be generated in a normal data output operation and a random data output operation.
Figure 10B:
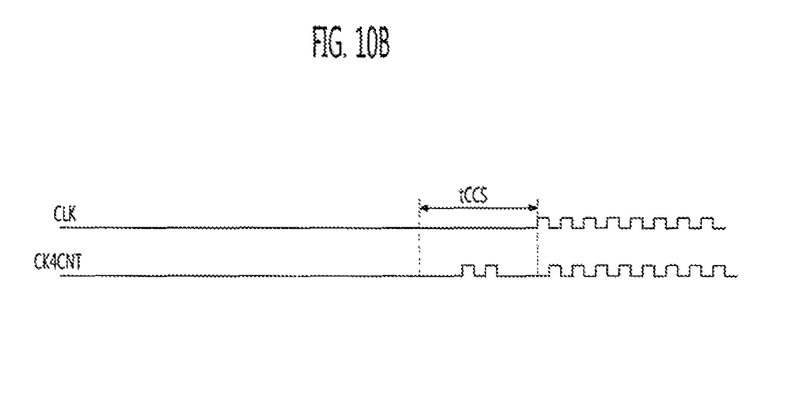

FIG. 8 illustrates waveforms of signals for illustrating an operation of the dummy count clock generator 720 according to an embodiment of this disclosure. FIG. 9 illustrates waveforms of signals for illustrating a data output method of the semiconductor memory device according to an embodiment of this disclosure. FIGS. 10A and 10B show waveforms of signals illustrating that count clocks may be generated in a normal data output operation and a random data output operation.

A method of operating the semiconductor memory device according to an exemplary embodiment of this disclosure is described below with reference to FIGS. 2 to 9, 10A, and 10B.

The semiconductor memory device may read data stored in the memory cell array 100 in a data read operation prior to a data output operation and store the read data in the page buffer unit 200. The voltage supply unit 500 may generate a read voltage Vread and a pass voltage Vpass in response to a control signal generated from the control unit 400. The X decoder 600 may supply the read voltage Vread to a selected word line (i.e., WL) of the memory cell array 100 and the pass voltage Vpass to unselected selected word lines in response to a control signal generated from the control unit 400. Next, the page buffer unit 200 may sense the potential of a bit line BL of the memory cell array 100 in response to a control signal generated from the control unit 400 and temporarily store read data, corresponding to the read potential, in the latches of the page buffer unit 200.

The data output operation may include a normal data output method of sequentially outputting data while sequentially increasing a column address and a random data output method of reading data in response to an external address.

In the normal data output method, the control unit 400 may generate the dummy count enable signal DM_CNT_EN_L so that the dummy count clock DM_CK4CNT is generated in a read section, that is, a busy section Busy (see FIG. 10A) in which data stored in the memory cell array 100 may be temporarily stored in the latches of the page buffer unit 200. Furthermore, in the random data output method, the control unit 400 may generate the dummy count enable signal DM_CNT_EN_L so that the dummy count clock DM_CK4CNT is generated in a section tCCS (see FIG. 10B) in which the final confirmation command Confirm Command may be inputted after an external address is received.

The count clock generation unit 700 may generate the count clock CK4CNT in response to the dummy count enable signal DM_CNT_EN_L generated from the control unit 400. This is described below.

The enable signal generator 721 of the dummy count clock generator 720 may generate the oscillator enable signal Enable and the internal dummy count enable signal DM_CNT_EN in response to the dummy count enable signal DM_CNT_EN_L. The oscillator 722 may generate the dummy count clock DM_CK4CNT having a specific cycle in response to the oscillator enable signal Enable. The oscillator controller 723 may be enabled in response to the internal dummy count enable signal DM_CNT_EN. The oscillator controller 723 may detect the dummy count clock DM_CK4CNT of the oscillator 722 which may be toggled by a set number and may generate the dummy clock end signal DM_CNT_END. The enable signal generator 721 may disable the oscillator enable signal Enable in response to the dummy clock end signal DM_CNT_END. Thus, the oscillator 722 may stop generating the dummy count clock DM_CK4CNT. As a result, the dummy count clock generator 720 may generate the dummy count clock DM_CK4CNT having the number of clocks equal to the set number.

The selector 730 may output the dummy count clock DM_CK4CNT as the count clock CK4CNT in response to the internal dummy count enable signal DM_CNT_EN.

The column address generation unit 800 may count the count clock CK4CNT previously generated before the clock signal CLK is generated and may generate the column address Col_Add according to the result of the count.

The Y decoder 300 may send data 00 to be first outputted, from among data stored in the page buffer unit 200, to the data line DL in response to the column address Col_Add generated from the column address generation unit 800 so that the data 00 may be outputted to a pipe latch coupled to the data line DL. As a result, in accordance with an embodiment of this disclosure, before the clock signal CLK is generated, the count clock CK4CNT may be generated using the dummy count clock DM_CK4CNT, a column address may be generated in advance using the generated count clock CK4CNT, and data to be first outputted may be previously transmitted to the data line DL. Accordingly, the time taken for a data output operation can be reduced.

When the clock signal CLK starts being toggled after the data to be first outputted is outputted to the data line DL, the normal count clock generator 710 may generate the normal count clock CK4CNT_org in response to the clock signal CLK.

The selector 730 may output the normal count clock CK4CNT_org as the count clock CK4CNT in response to the internal dummy count enable signal DM_CNT_EN that is disabled.

The column address generation unit 800 may count the count clock CK4CNT and may generate the column address Col_Add according to a result of the count.

The Y decoder 300 sends the remaining data 01, 02, 03, 04, 05, . . . other than the data 00 to be first outputted, from among the data stored in the page buffer unit 200, to the data line DL in response to the column address Col_Add generated from the column address generation unit 800 so that the remaining data 01, 02, 03, etc., may outputted to the pipe latched coupled to the data line DL.

As described above, the semiconductor memory device of the present disclosure may generate the count clock signal in response to the dummy count clock signal before the clock signal is toggled in a data output operation and may generate a column address in response to the generated count clock signal. Accordingly, a margin for a data output operation can be improved, and thus the data output operation can be rapidly performed.

Furthermore, in a data output operation, before the normal count clock is generated, the dummy count clock may be generated, and some data may be outputted to the data line using the generated dummy count clock. Accordingly, the time taken for the data output operation can be reduced.

What is claimed is:

1. A semiconductor memory device, comprising:
   a count clock generation unit for generating a count clock in response to a clock signal and a dummy count clock;
   a column address generation unit for generating a column address in response to the count clock; and
   a Y decoder for sending data, stored in a page buffer unit, to a data line in response to the column address.

2. The semiconductor memory device of claim 1, wherein the dummy count clock is toggled before the clock signal is received.

3. The semiconductor memory device of claim 2, wherein the count clock generation unit comprises:
   a normal count clock generator for generating a normal count clock in response to the clock signal;
   a dummy count clock generator for generating an internal dummy count enable signal and a dummy count clock in response to a dummy count enable signal; and
   a selector for outputting the normal count clock or the dummy count clock as the count clock in response to the internal dummy count enable signal.

4. The semiconductor memory device of claim 3, wherein the dummy count clock generator comprises:
   an enable signal generator configured to generate the internal dummy count enable signal and an oscillator enable signal in response to the dummy count enable signal and to disable the oscillator enable signal in response to a dummy count end signal;
   an oscillator configured to generate the dummy count clock having a specific cycle in response to the oscillator enable signal; and
   an oscillator controller enabled in response to the internal dummy count enable signal and configured to generate the dummy count end signal when the dummy count clock reaches a set number.

5. The semiconductor memory device of claim 4, wherein the enable signal generator comprises:
   a delay unit for delaying the dummy count enable signal and outputting a delayed signal; and
   a logic gate for generating the oscillator enable signal in response to the delay signal of the delay unit and the dummy clock end signal.

6. The semiconductor memory device of claim 4, wherein the oscillator comprises:
   a logic gate for generating the dummy count clock by logically combining the oscillator enable signal and a feedback signal; and
   a delay unit for delaying the dummy count clock for a set time, inverting the delayed signal, and outputting the inverted signal as the feedback signal.

7. The semiconductor memory device of claim 4, wherein the oscillator controller comprises:
   a first flip-flop unit enabled in response to the internal dummy count enable signal and configured to synchronize a power source voltage with the dummy count clock and to output the synchronized output signal; and
   a second flip-flop unit enabled in response to the internal dummy count enable signal and configured to synchronize the output signal of the first flip-flop unit with the dummy count clock and to output the synchronized output signal as the dummy count end signal.

8. The semiconductor memory device of claim 1, wherein in a data output operation using a normal data output method, the dummy count clock is toggled in a busy section.

9. The semiconductor memory device of claim 8, wherein in a data output operation using a random data output method, the dummy count clock is toggled in a section in which a final confirmation command is received.

10. A semiconductor memory device, comprising:
    a page buffer unit for temporarily storing a plurality of read data;
    a Y decoder for sending the plurality of read data to a data line in response to a column address;
    a count clock generation unit for generating a count clock in response to a clock signal, and generating the count clock in response to a dummy count enable signal; and
    a column address generation unit for generating the column address by counting the count clock.

11. The semiconductor memory device of claim 10, wherein the generating of the count clock in response to a dummy count enable signal is performed before the clock signal is received.

12. The semiconductor memory device of claim 11, wherein the count clock generation unit comprises:
    a normal count clock generator for generating a normal count clock in response to the clock signal;
    a dummy count clock generator for generating an internal dummy count enable signal and a dummy count clock in response to a dummy count enable signal; and
    a selector for outputting the normal count clock or the dummy count clock as the count clock in response to the internal dummy count enable signal.

13. The semiconductor memory device of claim 12, wherein the dummy count clock generator comprises:
    an enable signal generator configured to generate the internal dummy count enable signal and an oscillator enable signal in response to the dummy count enable signal and to disable the oscillator enable signal in response to a dummy count end signal;
    an oscillator configured to generate the dummy count clock having a specific cycle in response to the oscillator enable signal; and an oscillator controller enabled in response to the internal dummy count enable signal and configured to generate the dummy count end signal when the dummy count clock reaches a set number.

14. The semiconductor memory device of claim 13, wherein the enable signal generator comprises:
   a delay unit for delaying the dummy count enable signal and outputting a delayed signal; and
   a logic gate for generating the oscillator enable signal in response to the delay signal of the delay unit and the dummy clock end signal.

15. The semiconductor memory device of claim 13, wherein the oscillator comprises:
   a logic gate for generating the dummy count clock by logically combining the oscillator enable signal and a feedback signal; and
   a delay unit for delaying the dummy count clock for a set time, inverting the delayed signal, and outputting the inverted signal as the feedback signal.

16. The semiconductor memory device of claim 13, wherein the oscillator controller comprises:
   a first flip-flop unit enabled in response to the internal dummy count enable signal and configured to synchronize a power source voltage with the dummy count clock and to output the synchronized output signal; and
   a second flip-flop unit enabled in response to the internal dummy count enable signal and configured to synchronize the output signal of the first flip-flop unit with the dummy count clock and to output the synchronized output signal as the dummy count end signal.

17. A method of operating a semiconductor memory device, comprising:
   generating a dummy count clock toggled by a set number;
   generating a first count clock in response to the dummy count clock;
   generating a first column address by counting the first count clock; and
   outputting first output data, from among data stored in a page buffer, to a data line in response to the first column address.

18. The method of claim 17, wherein the dummy count clock is toggled by the set number before a clock signal is enabled.

19. The method of claim 17, further comprising:
   generating a normal count clock in response to the clock signal enabled in a data output operation;
   generating a second count clock in response to the normal count clock;
   generating a second column address by counting the second count clock; and
   outputting remaining output data of the data, stored in the page buffer, other than the first output data to the data line in response to the second column address.

20. The method of claim 18, wherein the dummy count clock is toggled in a busy section of a normal data output operation or a section of a random data output operation in which a final confirmation command is received.

* * * * *